United States Patent [19]
Choi et al.

[11] Patent Number: 5,734,609
[45] Date of Patent: Mar. 31, 1998

[54] INTEGRATED CIRCUIT MEMORY DEVICES HAVING REDUCED SUSCEPTIBILITY TO INADVERTENT PROGRAMMING AND ERASURE AND METHODS OF OPERATING SAME

[75] Inventors: Jung-dal Choi; Dong-Jun Kim, both of Kyungki-do, Rep. of Korea

[73] Assignee: Samsung Electronics Co., Ltd., Suwon, Rep. of Korea

[21] Appl. No.: 757,266

[22] Filed: Nov. 29, 1996

[30] Foreign Application Priority Data

Nov. 29, 1995 [KR] Rep. of Korea ............... 1995-44894

[51] Int. Cl.⁶ .................................................. G11C 11/40
[52] U.S. Cl. ....................... 365/185.17; 365/185.05; 365/185.11; 365/63
[58] Field of Search ........................ 365/63, 185.17, 365/185.05, 185.11

[56] References Cited

U.S. PATENT DOCUMENTS

| | | | |
|---|---|---|---|
| 5,253,206 | 10/1993 | Tanaka et al. | 365/185.17 |
| 5,392,238 | 2/1995 | Kirisawa | 365/185.17 |
| 5,589,699 | 12/1996 | Araki | 365/185.17 |

*Primary Examiner*—Vu A. Le
*Attorney, Agent, or Firm*—Myers, Bigel, Sibley & Sajovec

[57] ABSTRACT

Integrated circuit memory devices having reduced susceptibility to inadvertent programming and erasure include an array of memory cells arranged as a plurality of NAND strings of EEPROM cells which share common control lines (e.g., SSL1, SSL2) and word lines (e.g., WL1–WLn). These NAND strings preferably comprise a linear array or chain of EEPROM cells having first and second ends and first and second select transistors (ST1, ST2) coupled (directly or indirectly) to the first and second ends, respectively. To provide improved program and erase capability, a pair of NAND strings are provided in antiparallel and share a common bit line. However, the pair of NAND strings are formed in respective nonoverlapping well regions in a substrate so that the channel regions of the EEPROM cells in respective NAND strings can be individually controlled (e.g., raised) to prevent inadvertent programming or erasing when cells in adjacent strings are being programmed or erased, respectively.

24 Claims, 6 Drawing Sheets

5,734,609

INTEGRATED CIRCUIT MEMORY DEVICES HAVING REDUCED SUSCEPTIBILITY TO INADVERTENT PROGRAMMING AND ERASURE AND METHODS OF OPERATING SAME

FIELD OF THE INVENTION

The present invention relates to integrated circuit semiconductor devices, and more particularly to integrated circuit memory devices and methods of operating integrated circuit memory devices.

BACKGROUND OF THE INVENTION

Semiconductor memory devices for storing data can typically be categorized as either volatile memory devices or nonvolatile memory devices. Volatile memory devices lose their stored data when their power supplies are interrupted, however nonvolatile memory devices retain their stored data even when their power supplies are interrupted. Thus, nonvolatile memory devices are widely used in applications where the possibility of power supply interruption is present.

Conventional nonvolatile memory devices include a type of electrically erasable programmable read only memory (EEPROM) device typically referred to as a flash EEPROM device. Flash EEPROM devices typically include a semiconductor substrate of first conductivity type (e.g., P-type), spaced source and drain regions of second conductivity type (e.g., N-type) in the substrate, a channel region at a face of the substrate, between the spaced source and drain regions, a floating gate for storing charge carriers when the device is programmed and a control gate which overlies the floating gate, opposite the channel region. Operation of a flash EEPROM device is typically divided into three modes including programming, erasing and reading.

Programming of a flash EEPROM device is typically achieved by biasing the drain region to a first positive bias, relative to the source region, and biasing the control gate to a second positive bias which is greater than the first positive bias. In the absence of any stored charge on the floating gate, these biases cause the formation of an inversion-layer channel of electrons at the face of the substrate, between the source and drain regions. As will be understood by those skilled in the art, the drain-to-source voltage accelerates these electrons through the channel to the drain region where they acquire sufficiently large kinetic energy and are typically referred to as "hot" electrons. The larger positive bias on the control gate also establishes an electrical field in a tunneling oxide layer which separates the floating gate from the channel region. This electric field attracts the hot electrons and accelerates them toward the floating gate, which is disposed between the control gate and the channel region, by a process known as tunneling. The floating gate then accumulates and traps the accumulated charge. Fortunately, the process of charging the floating gate is self-limiting. The negative charge that accumulates on the floating gate reduces the strength of the electric field in the tunneling oxide layer to the point where it is no longer capable of accelerating "hot" electrons from the drain side of the channel region.

As will be understood by those skilled in the art, the accumulation of a large quantity of trapped charge (electrons) on the floating gate will cause the effective threshold voltage ($V_{th}$) of the field effect transistor comprising the source region, drain region, channel region and control gate to increase. If this increase is sufficiently large, the field effect transistor will remain in a nonconductive "off" state when a predetermined "read" voltage is applied to the control gate during a read operation (i.e., $V_{th} > V_{read}$). In this state, known as the programmed state, the EEPROM device may be said to be storing a logic 0. Once programmed, the EEPROM device retains its higher threshold voltage even when its power supply is interrupted or turned off for long periods of time.

Reading of the EEPROM device is achieved by applying a predetermined read voltage ($V_{read}$) to the control gate, typically via a word line connecting a row of identical EEPROM devices or "cells", and applying a positive bias to the drain region, typically via a bit line connecting a column of identical EEPROM cells. If the EEPROM device is programmed, it will not conduct drain current ($I_{ds}$). However, if the EEPROM device has not been programmed (or has been erased), it will heavily conduct. In this state, the EEPROM device may be said to be storing a logic 1. Thus, by monitoring the bit line current, the programmed state (i.e., 1 or 0) of the EEPROM device can be determined.

Erasing of the EEPROM device may also be achieved by removing the stored charge from the floating gate. The erasure process can be achieved, for example, by grounding the control gate and applying a positive bias to the substrate (e.g., 10-20 Volts). Accordingly, flash EEPROM devices typically require bulk erasure of large portions of an array of cells since the effects of applying a large substrate bias typically cannot be confined to a single EEPROM cell.

As will be understood by those skilled in the art, a flash EEPROM integrated circuit memory device may contain a column-by-column array of NAND EEPROM cells having the general construction illustrated in cross-section and schematically by FIGS. 11.58 and 11.59 from a handbook by B. Prince et al. entitled *Semiconductor Memories*, John Wiley & Sons Ltd., pp. 603-604 (1991); and in an article by M. Momodomi et al. entitled *An Experimental 4-Mbit CMOS EEPROM with an NAND Structured Cell*, IEEE Journal of Solid State Circuits, Vol. 24, No. 5, p. 1238 October (1989). FIGS. 1-3 herein also illustrate a similar NAND string of EEPROM cells containing first and second select transistors S1 and S2, respectively, and a column or string of flash EEPROM unit cells (C1-Cn) connected in series between the first and second select transistors. As illustrated, the NAND string has a length "y" and a width "x". The operation of the NAND string of FIGS. 1-3 is more fully described in commonly assigned U.S. Pat. No. 5,473,563 to Suh et al. entitled *Nonvolatile Semiconductor Memory*, the disclosure of which is hereby incorporated herein by reference.

The NAND string of FIG. 1 comprises a first string select transistor S1 having a drain connected to a corresponding bit line B/L in an integrated circuit memory device. The source (S) of the first string select transistor S1 is also connected to a drain of a first EEPROM cell C1 in the string. A second select transistor S2 is also electrically connected in series between the source of the last EEPROM cell Cn and ground (GND) or a common signal line S/L. As illustrated by FIGS. 3A-3B, each EEPROM cell in the NAND string has a control gate 230, which is connected to control gates of cells in other NAND strings by a word line, a floating gate 220 and source and drain regions 240 (e.g., N-type in a P-type substrate 210).

To program an EEPROM cell within a NAND string, a number of programming steps are typically performed as now described. For example, the bit line B/L of the NAND string is typically held a ground potential (logic 0). The gate of the second select transistor S2 is also set to logic 0 potential to maintain the second select transistor S2 in a nonconductive (i.e., "off") state. The first select transistor S1 is also turned-on by setting the gate S1 thereof to a logic 1 potential. This electrically connects the source (S) of the first select transistor S1 to the bit line B/L which is at ground potential. The control gate 230 of an EEPROM cell (e.g., Cn) to be programmed is also set to a sufficiently high program voltage (e.g., $V_{pgm}$=18 V) to cause Fowler-Nordheim tunneling of hot electrons from the drain side of its respective channel into its respective floating gate 220. These electrons are provided by the bit line B/L by setting the control gates (e.g., C1–Cn-1) of the EEPROM cells which are not being programmed to sufficiently high pass voltages (e.g., $V_{pass}$=10 V) to render these transistors conductive (i.e., "on") regardless of their programmed state (i.e., threshold voltage).

Referring now to FIG. 4, an integrated circuit memory device containing a pair of side-by-side NAND strings 110 and 120 of EEPROM cells according to the prior art is illustrated. In particular, a first NAND string 110 of EEPROM cells is typically formed in a P-well region contained within a substrate and a second NAND string 120 of EEPROM cells is formed in the same P-well region. The P-well region is connected to a well region pick-up line WPL which can be biased to prevent the P-well region from "floating". The drain regions of the first select transistors S1 are also connected to respective bit lines B/L1 and B/L2 and the source regions of the second select transistors S2 are also commonly connected to a source line S/L. As described more fully hereinbelow, inadvertent programming of unselected memory cells in a selected NAND string (e.g., first string) may occur if the pass voltage is too high, however, inadvertent programming of unselected memory cells in an unselected NAND string (e.g., second string) may occur if the pass voltage is too low. Also, during erasing operations, all EEPROM cells connected to the selected word line (i.e., a "page" of EEPROM cells) are simultaneously erased.

Because programming of selected EEPROM cells in the first NAND string 110 of FIG. 4 must be performed without altering the already programmed states of the EEPROM cells in the unselected second NAND string 120 or the programmed states of unselected EEPROM cells in the first NAND string 110, steps may be required to prevent inadvertent programming of unselected memory cells. To prevent such inadvertent programming, two conventional programming methodologies have been used. According to a first methodology, the bit line B/L2 of an unselected string 120 is set to a relatively high logic 1 potential (which is typically significantly greater than the power supply voltage VCC) and the corresponding first select transistor S1' is turned on "hard" by applying a relatively large potential bias to its gate SSL1. As will be understood by those skilled in the art, this sequence of steps drives the source (S) of the first select transistor S1' to the potential of the bit line B/L2 and also drives the source, drain and channel regions of the EEPROM cells C1'–Cn' towards the potential of the source of the first select transistor S1'. Accordingly, if the potential of the bit line B/L is sufficiently high, the occurrence of inadvertent programming caused by Fowler-Nordheim tunneling can be prevented even though the gates of the EEPROM cells (i.e., word lines W/L1–W/Ln) of FIG. 1 are being held at respective pass and program potentials (e.g., 10 or 18 V) during programming of the first NAND string 110. Yet, because this methodology requires the generation of a high bit line potential using relatively large high voltage latch transistors and associated structures, it is typically not preferred.

According to a second conventional methodology, the bit line B/L2 and the gate SSL1 of the first select transistor S1' are set to the power supply voltage VCC. As will be understood by those skilled in the art, this sequence of steps drives the source of the first select transistor S1' to a potential of about VCC-$V_{th}$, where "$V_{th}$" is the threshold voltage of the first select transistor S1'. However, once the source of the first select transistor S1' reaches a potential of about VCC-$V_{th}$, the first select transistor S1' turns off. When this occurs, the source, drain and channel regions of the EEPROM cells C1'–Cn' become electrically disconnected from the bit line B/L2 and enter a "floating" state. But, because the source, drain and channel regions of the EEPROM cells C1'–Cn' are capacitively coupled to their respective control gates W/L1–W/Ln, the application of respective pass and program potentials (e.g., $V_{pass}$=10 V and $V_{pgm}$=18 V) to the control gates will cause the potentials of the source, drain and channel regions to be increased or "boosted" by an amount equal to "$V_{boost}$". This boosting effect prevents the full gate potential of $V_{pgm}$ or $V_{pass}$ from being established between the control gate and channel region of the EEPROM cells C1'–Cn' and thereby inhibits the likelihood of inadvertent programming caused by Fowler-Nordheim tunneling of "hot" electrons into the floating gates of the EEPROM transistors C1'–Cn' during programming of the first NAND string.

As will be understood by those skilled in the art, the magnitude of "$V_{boost}$" depends on, among other things, the degree of capacitive coupling and the magnitude of the pass voltage $V_{pass}$ and program voltage $V_{pgm}$. In particular, due to capacitive coupling and charge sharing between the source of the first select transistor S1' and the source, drain and channel regions of the EEPROM cells C1'–Cn', the potentials of the source, drain and channel regions ("$V_{sdc}$") are typically increased to a level of about $V_{sdc} \approx V_{boost}$+ (VCC-$V_{th}$)/n+1. Thus, to prevent inadvertent programming, the magnitude of the difference between $V_{pgm}$ and $V_{sdc}$ must be sufficiently low to prevent Fowler-Nordheim tunneling. But, because $V_{sdc}$ is reduced as the power supply voltage VCC is reduced, inadvertent programming may occur in integrated circuit memory devices having low power supply voltages VCC and low pass voltages $V_{pass}$. Improvements on the above described boosting techniques are also more fully described in commonly assigned U.S. application Ser. No. 08/716,022 entitled *Methods of Programming Flash EEPROM Integrated Circuit Memory Devices To Prevent Inadvertent Programming of Nondesignated NAND Memory Cells Therein*, filed Sep. 19, 1996, the disclosure of which is hereby incorporated herein by reference.

Accordingly, in memory devices such as the NAND memory array of FIG. 4, it has been necessary to carefully select the appropriate pass voltage $V_{pass}$ to prevent inadvertent programming of unselected memory cells (i.e., C2–Cn) in a selected NAND string and selected memory cells (C1') in an unselected NAND string. This selection requirement is best illustrated by FIG. 5 which shows a graph of the variation in the threshold voltage of an unselected erased memory cell (curve a) in a selected string and the variation in the threshold voltage of a selected erased memory cell (curve b) in an unselected string, as a function of a pass voltage. As illustrated by curve (a) in FIG. 5, if $V_{pass}$ is too high, unwanted Fowler-Nordheim tunneling may take place to inadvertently program unselected erased cells. However, as illustrated by curve (b) in FIG. 5, if $V_{pass}$ is too low because of low VCC, insufficient voltage boosting will take place and selected erased cells in unselected strings may become inadvertently programmed.

Thus, notwithstanding the above described techniques for improving the operation of integrated circuit memory devices, there continues to be a need improved programming methodologies which do not require the presence of large high voltage transistors and are less susceptible to inadvertent programming.

SUMMARY OF THE INVENTION

It is therefore an object of the present invention to provide improved integrated circuit memory devices and methods of operating same.

It is another object of the present invention to provide highly integrated memory devices with high operating speeds and methods of operating same.

It is still another object of the present invention to provide integrated circuit memory devices having cells therein which can be selectively programmed and erased.

These and other objects, features and advantages of the present invention are provided by integrated circuit memory devices having reduced susceptibility to inadvertent programming and erasure of memory cells therein and methods of operating same. According to preferred embodiments of the present invention, integrated circuit memory devices comprise an array of memory cells arranged as a plurality of NAND strings of EEPROM cells which share common control lines (e.g., SSL1, SSL2) and word lines (e.g., WL1-WLn). Each of these NAND strings preferably comprise a linear array or chain of EEPROM cells having first and second ends and first and second select transistors (ST1, ST2) coupled (directly or indirectly) to the first and second ends, respectively. In particular, to provide improved program and erase capability, a pair of NAND strings are provided which share a common bit line. However, each pair of NAND strings are formed in respective nonoverlapping well regions in a substrate so that the channel regions of the EEPROM cells in respective NAND strings can be individually controlled (e.g., raised) to prevent inadvertent programming when cells in adjacent strings are being programmed. Independent control of the channel regions also eliminates the necessity of performing page erase operations, but allowing individual cells to be selectively erased.

For example, an integrated circuit memory device according to the present invention preferably comprises a semiconductor substrate (e.g., N-type) containing at least first and second semiconductor regions of first conductivity type (e.g., P-wells) therein at adjacent nonoverlapping locations. First and second NAND strings of EEPROM cells are also provided in the first and second semiconductor regions, respectively, so that during programming of a selected EEPROM cell in a selected first NAND string, the second semiconductor region can be biased with a program inhibition voltage (e.g., $V_{pi}$, where $VCC<V_{pi}<7$ V) to prevent inadvertent programming of a corresponding selected cell in the unselected second NAND string. Thus, it is not necessary to rely on elaborate techniques to boost voltages using capacitive coupling in unselected NAND strings, in order to prevent inadvertent programming.

To achieve these preferred aspects of the present invention, the first and second NAND strings are preferably electrically connected in antiparallel so that (i) a gate electrode of a first select transistor in the second NAND string and a gate electrode of a second select transistor in the first NAND string are electrically connected to a first string selection line (SSL1), and (ii) a drain region of a first select transistor in the first NAND string and a drain region of the first select transistor in the second NAND string are electrically connected to a common bit line (B/L). Accordingly, a memory device containing a large array of NAND strings is preferably arranged so that each individual NAND string in the array is surrounded on each side by an antiparallel-connected NAND string (which may be patterned as a mirror-image of the individual NAND string or as a similar NAND string).

In addition, according to a first preferred embodiment of the present invention, a gate electrode of the first select transistor in the first NAND string and a gate electrode of a second select transistor in the second NAND string are electrically connected to a second string selection line (SSL2) so that the first and second string selection lines (SSL1, SSL2) can be used to select either the first NAND string or the second NAND string one-at-a-time during programming, reading and erasing operations. According to a second preferred embodiment of the present invention, depletion-mode transistors are also used to provide one-at-a-time control of the first and second NAND strings.

Preferred embodiments of the present invention also include methods of operating the above described preferred integrated circuit memory devices. These methods include the steps of disconnecting the EEPROM cells in the second NAND string from the bit line (B/L) by turning off the first select transistor therein and applying a pass voltage (e.g., $V_{pass}$ where $1$ V$<V_{pass}<$VCC) to control gates of a plurality of unselected EEPROM cells in the first and second NAND strings. The EEPROM cells in the first NAND string are then connected to the bit line by turning on the first select transistor therein and then a first program voltage (e.g., $V_{pgm}$, where $15$ V$<V_{pgm}<20$ V) is applied to a control gate of a selected EEPROM cell in the first NAND string and a selected EEPROM cell in the second NAND string. To prevent inadvertent programming of the selected EEPROM cell in the second NAND string, a program inhibition voltage (i.e., $V_{pi}$) is applied to the second semiconductor region of first conductivity type during the step of applying a first program voltage. This program inhibition voltage ($V_{pi}$) independently "boosts" the channel regions of the selected and unselected EEPROM cells in the second NAND strings (during programming of the first NAND string, to prevent inadvertent programming.

The NAND strings can also be read one-at-a-time via the common bit line by (i) turning on the second select transistor in the first NAND string and the first select transistor in the second NAND string, (ii) turning on the first select transistor in the first NAND string and turning off the second select transistor in the second NAND string to enable a state of a selected EEPROM cell in the first NAND string to be read (while the second select transistor in the first NAND string is turned-on), and (iii) turning on the second select transistor in the second NAND string and turning off the first select transistor in the first NAND string to enable a state of a selected EEPROM cell in the second NAND string to be read (while the first select transistor in the second NAND string is turned-on).

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout. Moreover, the terms "first conductivity type" and "second conductivity type" refer to opposite conductivity type such as P or N-type, however, each embodiment described and illustrated herein includes its complementary embodiment as well.

Figure 1:
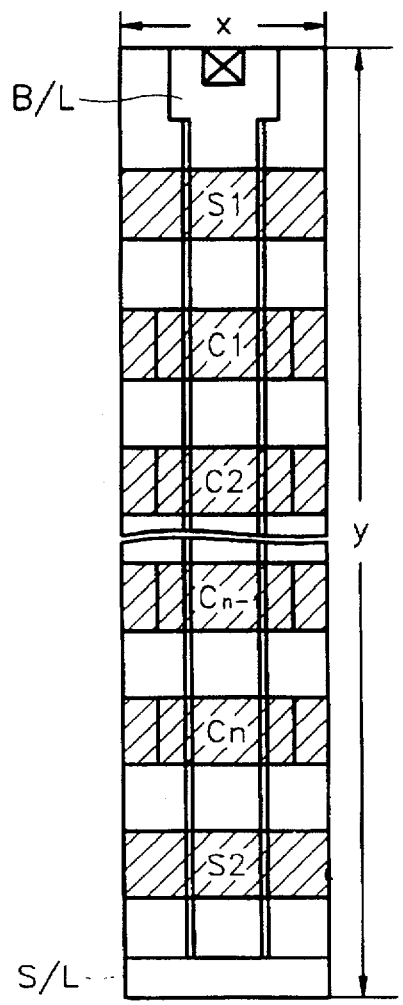
FIG. 1 is a plan view illustrating a NAND string of memory cells according to the prior art.
Figure 2:
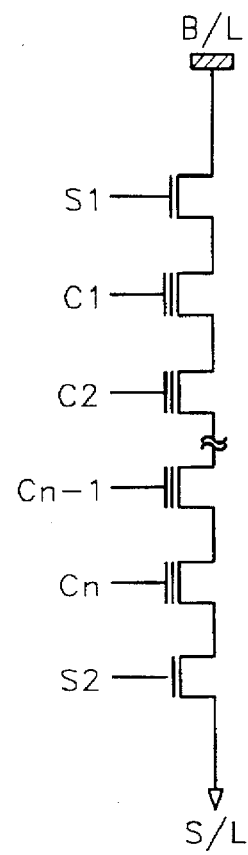
FIG. 2 is equivalent electrical circuit schematic of the NAND string of FIG. 1.
Figure 3A:
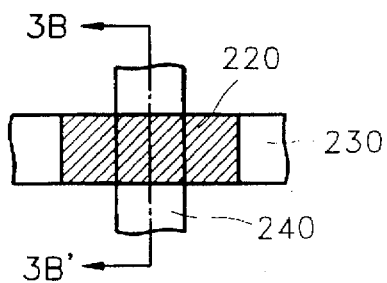
FIG. 3A is a plan view of an EEPROM cell according to the prior art.
Figure 3B:
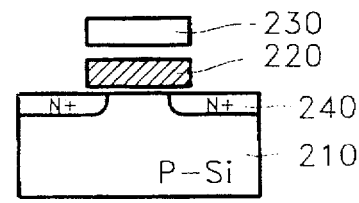
FIG. 3B is a cross-sectional view of an EEPROM cell, taken along line 3B-3B' of FIG. 3A.
Figure 4:
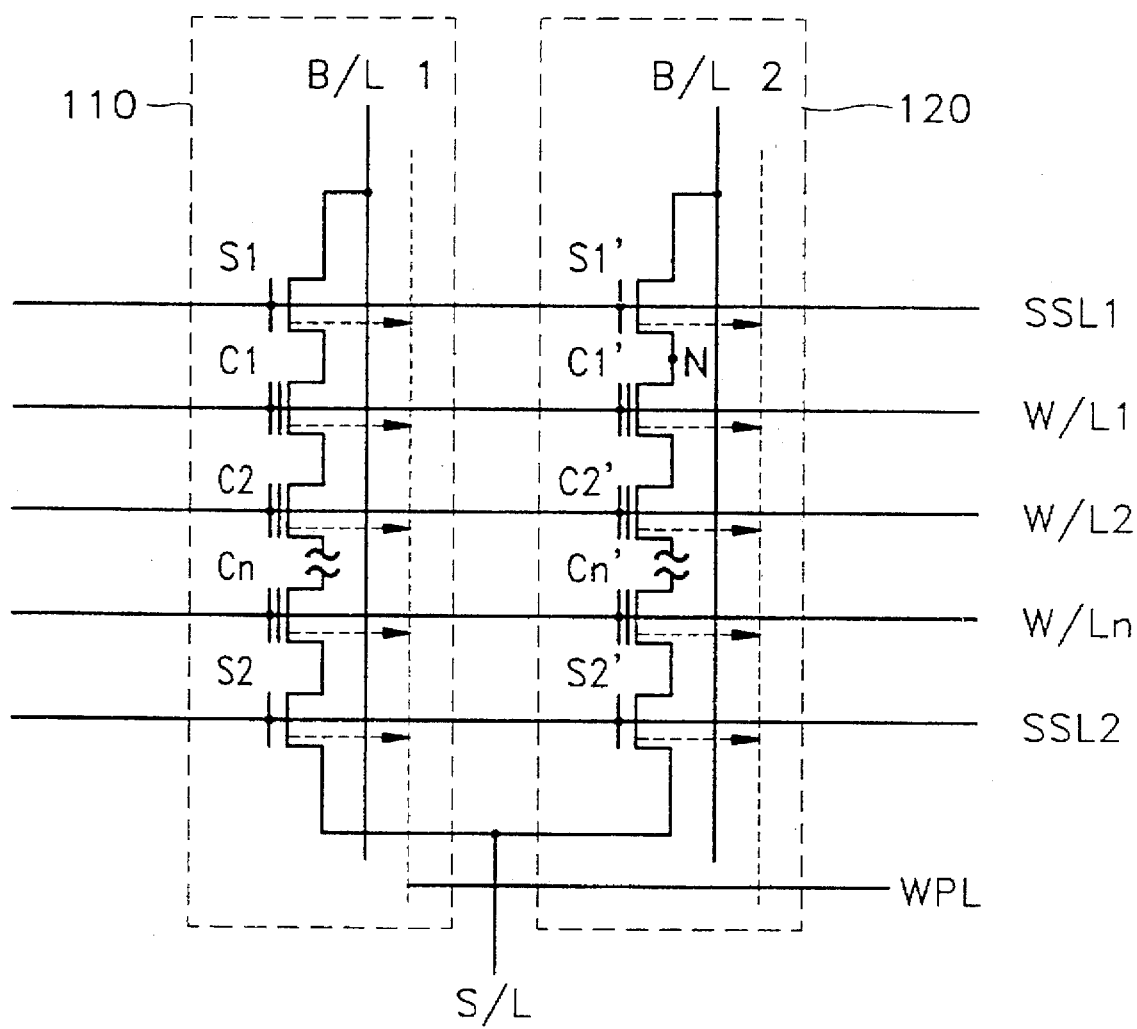
FIG. 4 is an electrical schematic of an integrated circuit memory device containing a pair of NAND strings according to the prior art.
Figure 5:
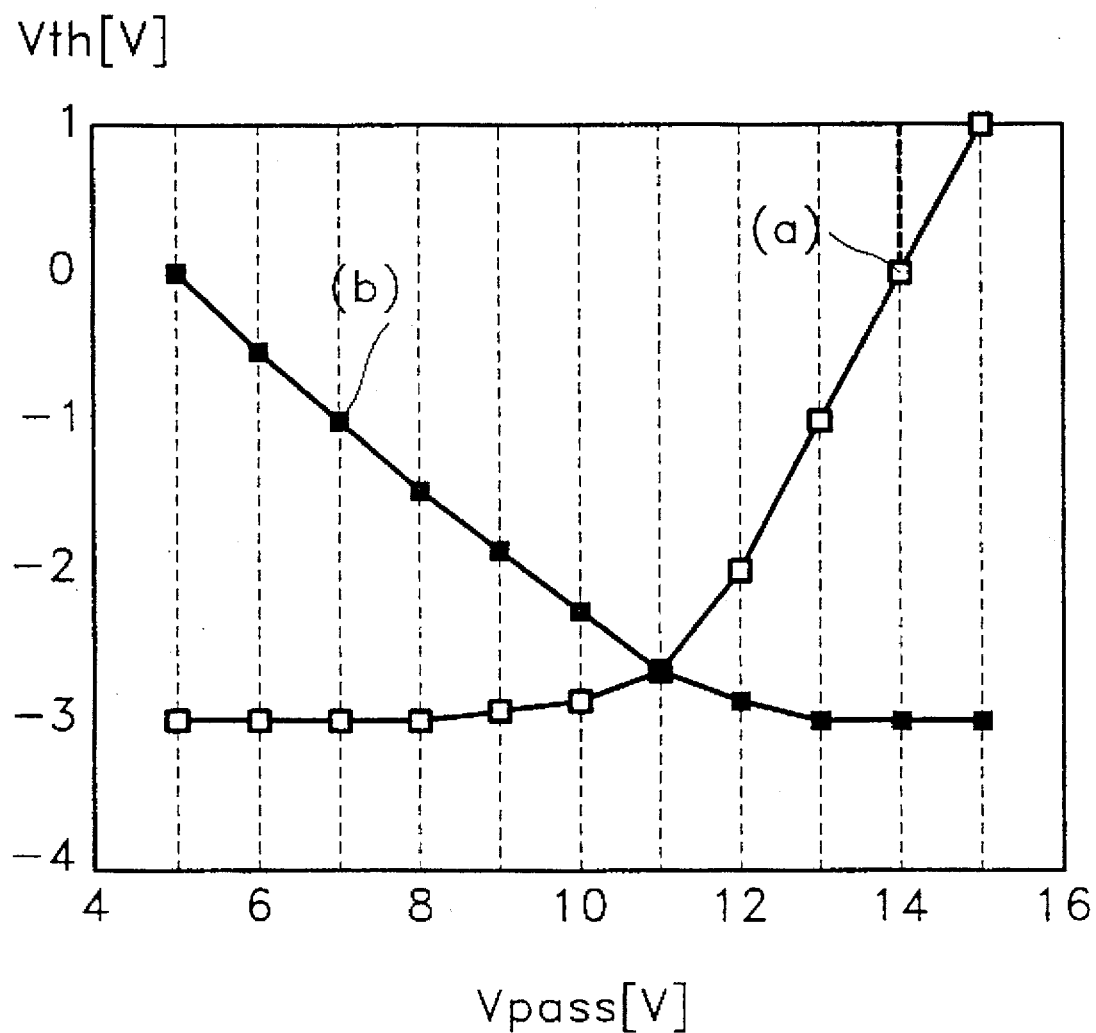
FIG. 5 is a graph illustrating the variation in the threshold voltage of an unselected erased memory cell (curve a) in a selected string and the variation in the threshold voltage of a selected erased memory cell (curve b) in an unselected string, as a function of a pass voltage.
Figure 6:
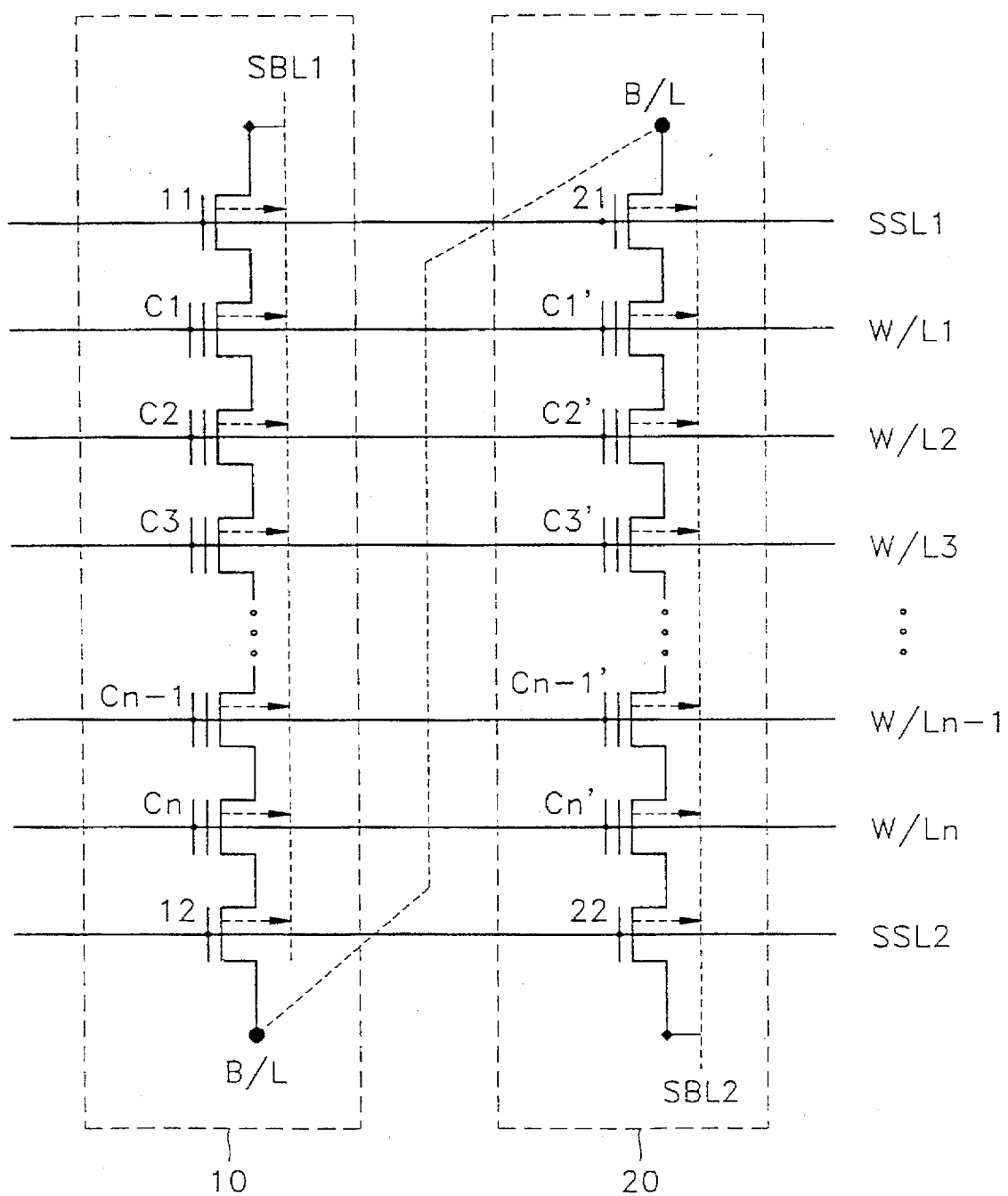
FIG. 6 is an electrical schematic of an integrated circuit memory device according to a first embodiment of the present invention.
Figure 7:
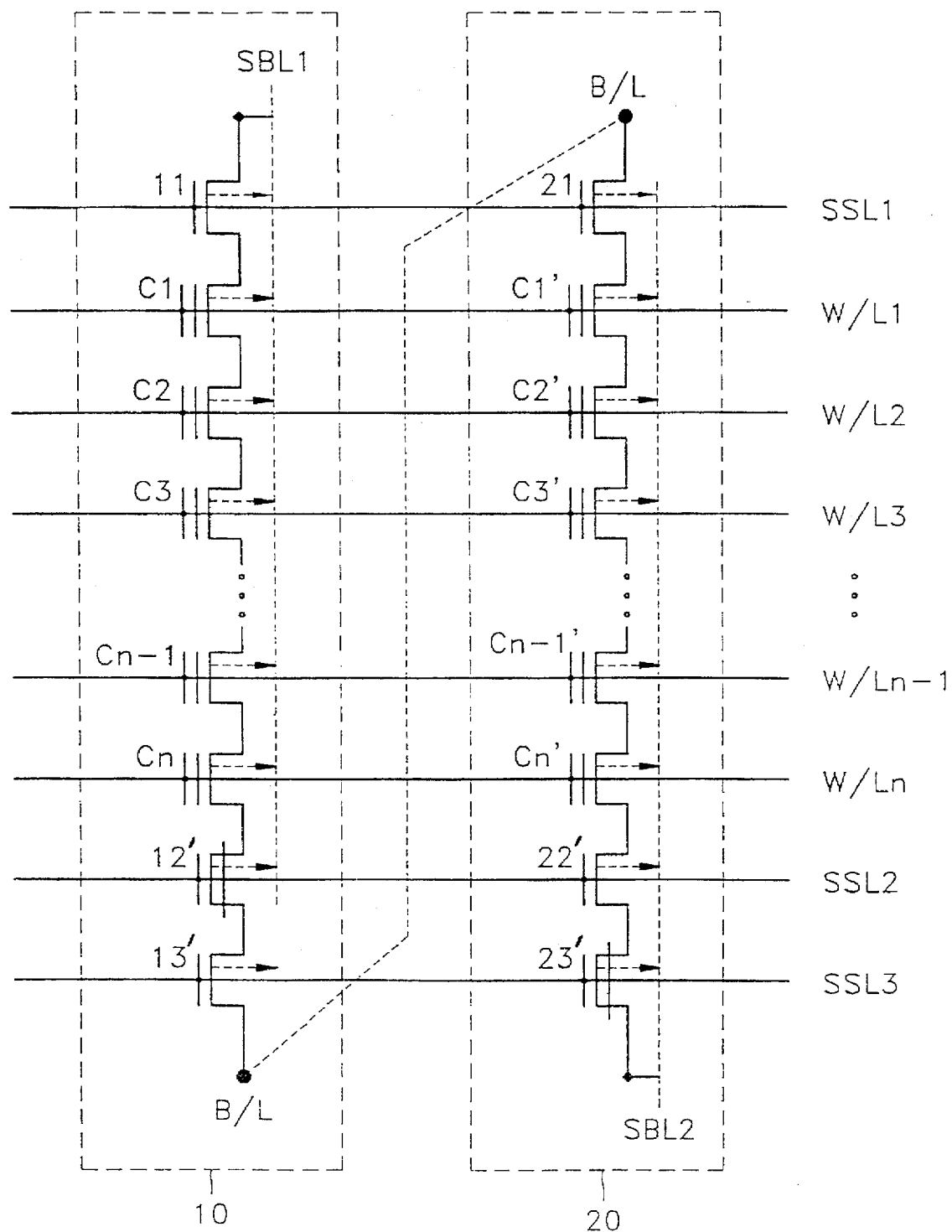
FIG. 7 is an electrical schematic of an integrated circuit memory device according to a second embodiment of the present invention.
Figure 8:
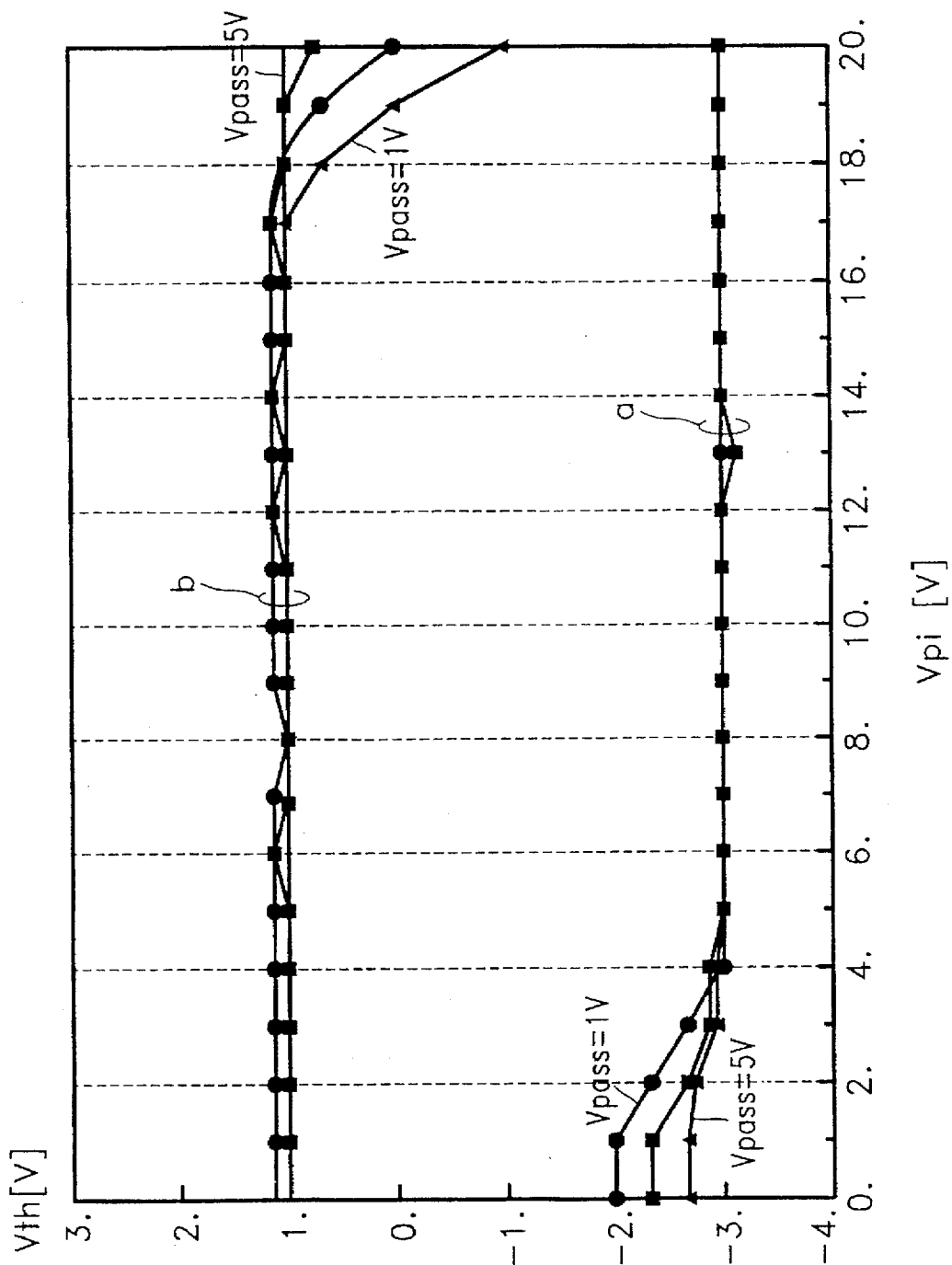
FIG. 8 is a graph is illustrating the influence of the magnitude of the program inhibition voltage on the threshold voltages of unselected erased cells (curve a) and unselected programmed cells (curve b), for various pass voltages, according to the present invention.

Referring now to FIGS. 6–8, preferred embodiments of the present invention will now be described. In particular, FIG. 6 illustrates a first embodiment of an integrated circuit memory device according to the present invention. As illustrated by FIG. 6, a pair of first and second NAND strings are provided in antiparallel in a semiconductor substrate (e.g., N-type). The first and second NAND strings are controlled, in part, by first and second string selection lines (SSL1, SSL2) and a plurality of word lines (W/L1–W/Ln). The first NAND string (left side) comprises a plurality of EEPROM memory cells C1–Cn electrically connected in series and arranged side-by-side in the substrate when viewed in transverse cross-section. At a first end of the cells C1–Cn, a first NMOS select transistor 12 is provided. As illustrated, the first select transistor 12 is electrically connected in series between a drain of the nth EEPROM cell Cn and a bit line (B/L). At a second end of the cells C1–Cn, a second NMOS select transistor 11 is provided. As illustrated, the second select transistor 11 is electrically connected in series between a source of the 1st EEPROM cell C1 and a first source body line (SBL1). The first and second select transistors 12 and 11, respectively, and the EEPROM cells C1–Cn are formed as NMOS devices in a first semiconductor region of first conductivity type (e.g P-type). Here, the dotted region illustrated as 10 may define a first P-well region which is spaced from a second P-well region 20 in an N-type semiconductor substrate. As illustrated, the first source body line (SBL1) is electrically connected to the source of the second select transistor 11 and the first P-type well 10. The electrical connection which "shorts" the N-type source of the second select transistor 11 to the first P-type well is provided by a first metal strap on a face of the substrate. This first metal strap may formed by patterning a layer of refractory metal such as polycide and aluminum. The bit line (B/L), shown as a dotted line, may also be formed concurrently with the formation of the first metal strap.

Similarly, the second NAND string (right side) comprises a plurality of EEPROM memory cells C1'–Cn' electrically connected in series and arranged side-by-side in the substrate when viewed in transverse cross-section. At a first end of the cells C1'–Cn', a first NMOS select transistor 21 is provided. As illustrated, the first select transistor 21 of the second NAND string is electrically connected in series between a drain of the 1st EEPROM cell C1' and the bit line (B/L). At a second end of the cells C1'–Cn', a second NMOS select transistor 22 is provided. As illustrated, the second select transistor 11 of the second NAND string is electrically connected in series between a source of the nth EEPROM cell Cn' and a second source body line (SBL2). The first and second select transistors 21 and 22, respectively, and the EEPROM cells C1'–Cn' are formed as NMOS devices in the second P-well region 20. The second source body line (SBL2) is electrically connected to the source of the second select transistor 22 and the second P-type well 10. The electrical connection which "shorts" the N-type source of the second select transistor 22 to the second P-type well 20 is provided by a second metal strap.

Thus, according to the first embodiment of the present invention, the first string selection line SSL1 is electrically connected to the gate of the first string select transistor 21 of the second NAND string and to the gate of the second string select transistor 11 of the first NAND string. The second string selection line SSL2 is electrically connected to the gate of the second string select transistor 22 of the second NAND string and to the gate of the first string select transistor 12 of the first NAND string. The control gates of respective first, second, third..., etc. EEPROM cells in the first and second NAND strings are also connected by respective word lines W/L1–W/Ln. As described more fully hereinbelow with respect to the reading operation, the threshold voltages of the first select transistors 12 and 21 of the first and second NAND strings are preferably less than the threshold voltages of the second select transistors 11 and 22 of the first and second NAND strings. For example, according to one aspect of the first embodiment, the first select transistors 12 and 21 have a threshold voltage of 0.5 V and the second select transistors 11 and 22 have a threshold voltage of 2.0 V.

Operations for programming a first EEPROM cell C1 of the first NAND string will now be described with reference to TABLE 1. In particular, the first NAND string is selected by setting the first string selection line SSL1 to VSS=0 V and the second string selection line SSL2 to the power supply potential VCC (e.g., 5 V). Application of these control signals (i) turns off the first select transistor 21 of the second NAND string and the second select transistor 11 of the first NAND string; and (ii) turns on the first select transistor 12 of the first NAND string and the second select transistor 22 of the second NAND string. Thus, the bit line B/L becomes electrically connected to the drain of the nth EEPROM cell Cn in the first NAND string. The bit line B/L is then set to 0 V and the selected first word line W/L1 is set to a program voltage (e.g., $V_{pgm}$, where $15 V < V_{pgm} < 20 V$). According to a preferred aspect of the present invention, inadvertent programming of the selected first EEPROM cell C1' in the second unselected NAND string is prevented by applying a program inhibition voltage (e.g., VCC<$V_{pi}$<7 V) to the second source body line SBL2, as described below. A low pass voltage (e.g., 1 V<$V_{pass}$<VCC) is then applied to the unselected word lines W/L2–W/Ln to render the EEPROM cells C2–Cn and C2'–Cn' conductive regardless of their program state (i.e., unprogrammed ($V_{th}$=−3 V) or programmed ($V_{th}$=1 V)). The first source body line SBL1 may also be set to 0 V.

As will be understood by those skilled in the art, the application of the above described voltages will electrically connect the bit line B/L to the P-type channel region of the selected EEPROM cell C1 in the first NAND string. In addition, because the control gate of the selected EEPROM cell C1 is being maintained at a program voltage $V_{pgm}$ of between 15 V and 20 V (because the first word line W/L1 is set to $V_{pgm}$), F-N tunneling of electrons from the channel region to the floating gate of the selected cell C1 will take place and cause the threshold voltage of the selected cell C1 to rise from ($V_{th}$ (unprogrammed)=−3 V) to ($V_{th}$ (programmed)=1 V). However, if the program inhibition voltage $V_{pi}$ is sufficiently large, the electric field from the channel region of the selected EEPROM cell C1' in the unselected second NAND string will be insufficient to cause F-N tunneling (because the program inhibition voltage will be passed to this channel region through the second select transistor 22 and the unselected EEPROM cells C2'–Cn' of the second NAND string). Accordingly, regardless of the magnitude of the pass voltage $V_{pass}$, inadvertent programming of unselected cells is prevented so long as the value of $V_{pgm}$−$V_{pi}$ is insufficient to cause F-N tunneling. Moreover, a low pass voltage $V_{pass}$ prevents inadvertent programming caused by F-N tunneling in the unselected EEPROM cells C2–Cn and a low value of $V_{pi}$−$V_{pass}$ prevents inadvertent erasing caused by F-N tunneling of electrons out of the floating gates of the unselected EEPROM cells C2'–Cn'. The above described operations may also be performed to program the EEPROM cells C1'–Cn' in the second NAND string by setting the first string selection line SSL1 to VCC and the second string selection line SSL2 to 0 V. Here, the notations in parentheses in the program column of TABLE 1 describe the values of the voltages needed to program the cells in the second NAND string.

Operations for erasing the first EEPROM cell C1 of the first NAND string will now be described. In particular, the first source body line SBL1 (and first P-well 10) is biased at an erase voltage (e.g., 15 V<$V_{erase}$<20 V) and the selected word line W/L1 is biased at 0 V to induce reverse F-N tunneling of electrons from the floating gate of the first EEPROM cell C1 into the P-well 10. This causes the threshold voltage of the erased cell to drop from 1 V to about −3 V, for example. However, because the second P-well 20 is allowed to "float", the selected EEPROM cell C1' in the unselected second NAND string is not erased. Moreover, to prevent inadvertent erasing of the unselected EEPROM cells C1–Cn in the first NAND string, the unselected word lines W/L2–W/Ln are preferably biased at an erase inhibition voltage (e.g., VCC<$V_{ei}$<10 V) so that the magnitude of the electric fields from the floating gates of the unselected cells to the P-well 10 are insufficient to cause F-N tunneling. As described by TABLE 1, during an erase operation, the other control lines are allowed to "float". Again, the notations in parentheses in the erase column of TABLE 1 describe the values of the voltages needed to erase cells in the second NAND string.

Operations for reading the first EEPROM cell C1 of the first NAND string will now be described. In particular, the first and second select transistors 12 and 11 of the first NAND string are turned-on to create an electrical path from the first source body line SBL1 to the bit line B/L which is precharged to VCC using a precharge circuit (not shown). For example, a first read voltage (e.g., $V_{read1}$>VCC) may be applied to the first string selection line SSL1 to turn on the second select transistor 11 ($V_{th}$=2.0 V) and turn on the first select transistor 21 ($V_{th}$=0.5 V) of the second NAND string. In addition, a second read voltage (e.g., 0.5 V<$V_{read2}$<2.0) is applied to the second string selection line SSL2 to turn on the first select transistor 12 ($V_{th}$=0.5 V) of the first NAND string, but not turn on the second select transistor 22 ($V_{th}$=2 V) of the second NAND string. The selected word line W/L1 is also set at an intermediate voltage (e.g., 0 V) between the threshold voltages of the EEPROM cells when programmed ($V_{th}$=1 V) and erased ($V_{th}$=−3 V) and the unselected word lines W/L2–W/Ln are set at a read voltage (2 V<$V_{read}$<VCC) having a value sufficient to render the unselected EEPROM cells C2–Cn conductive regardless of their program state. Accordingly, as will be understood by those skilled in the art, if the selected EEPROM cell C1 is programmed it will not turn on and the bit line B/L will remain in the precharge state; however, if the selected EEPROM cell C1 is not programmed (i.e., erased) it will turn on and pull the bit line to a logic 0 state. Thus, the state of the bit line after performance of a read operation can be sensed to determine the state of the selected cell. Again, the notations in parentheses in the read column of TABLE 1 describe the values of the voltages needed to read cells in the second NAND string.

TABLE 1

|  | PROGRAM | READ | ERASE |
| --- | --- | --- | --- |
| SELECTED B/L | 0 | VCC | FLOAT |
| UNSELECTED B/L | FLOAT | FLOAT | FLOAT |
| SSL1 | 0 (VCC) | $V_{read1}$ ($V_{read2}$) | FLOAT |
| SSL2 | VCC (0) | $V_{read2}$ ($V_{read1}$) | FLOAT |
| SELECTED WL | $V_{pgm}$ | 0 | 0 |
| UNSELECTED WL | $V_{pass}$ | $V_{read}$ | $V_{ei}$ or FLOAT |
| SBL1 | 0 ($V_{pi}$) | 0 | $V_{erase}$ (FLOAT) |
| SBL2 | $V_{pi}$ (0) | 0 | FLOAT ($V_{erase}$) |

Referring now to FIG. 7, an integrated circuit memory device according to a second embodiment of the present invention will now be described with reference to TABLE 2. The memory device of FIG. 7 is similar in construction to the device of FIG. 6. The programming and erase operations for the device of FIG. 7 and the device of FIG. 6 are similar as well and need not be described further herein. However, the memory device of FIG. 7 eliminates the need to generate the first and second read voltages $V_{read1}$ and $V_{read2}$ to select the first and second NAND strings, as illustrated by TABLE 1 and described above with respect to the device of FIG. 6. Instead, first and second depletion-mode (i.e., normally "on") transistors 12' and 23' and an additional string selection line SSL3 are provided so that a reading operation can be performed with only one read voltage $V_{read}$, as illustrated by TABLE 2 and described more fully hereinbelow. Stated another way, instead of having to generate three (3) separate read voltages: $V_{read1}$ (e.g., $V_{read1}$>VCC), $V_{read2}$ (e.g., 0.5 V<$V_{read2}$<2 V) and $V_{read}$ (e.g., 2 V<$V_{read}$<VCC), only one read voltage $V_{read}$ is required to operate the memory device of FIG. 7.

In particular, to read a cell in the first NAND string, the first select transistor 21 of the second NAND string and the second select transistor 11 of the first NAND string are turned on by applying $V_{read}$ to SSL1, the second select transistor 22' of the second NAND string is turned off by applying 0 V to SSL2 and the first select transistor 13' of the first NAND string is turned on by applying $V_{read}$ to SSL3. Similarly, to read a cell in the second NAND string, the first select transistor 21 of the second NAND string and the second select transistor 11 of the first NAND string are turned on by applying $V_{read}$ to SSL1, the second select transistor 22' of the second NAND string is turned on by applying $V_{read}$ to SSL2 and the first select transistor 13' of the first NAND string is turned off by applying 0 V to SSL3. As will be understood by those skilled in the art, the first and second depletion-mode transistors act as electrical "shorts" and are provided so that the second and third string selection lines SSL2 and SSL3 can be formed in straight-line patterns across an array of antiparallel-connected NAND strings.

TABLE 2

|  | PROGRAM | READ | ERASE |
| --- | --- | --- | --- |
| SELECTED B/L | 0 | VCC | FLOAT |
| UNSELECTED B/L | FLOAT | FLOAT | FLOAT |
| SSL1 | 0 (VCC) | $V_{read}$ | FLOAT |
| SSL2 | 0 | 0 ($V_{read}$) | FLOAT |
| SSL3 | VCC (0) | $V_{read}$ (0) | FLOAT |
| SELECTED WL | $V_{pgm}$ | 0 | 0 |
| UNSELECTED WL | $V_{pass}$ | $V_{read}$ | $V_{ei}$ or FLOAT |
| SBL1 | 0 ($V_{pi}$) | 0 | $V_{erase}$ (FLOAT) |
| SBL2 | $V_{pi}$ (0) | 0 | FLOAT ($V_{erase}$) |

Referring now to FIG. 8, a graph is provided illustrating the influence of the magnitude of the program inhibition voltage $V_{pi}$ on the threshold voltages of unselected erased cells (curve a) and unselected programmed cells (curve b), for various pass voltages: $V_{pass}$=1, 3 and 5 V. As illustrated, only at very high values of $V_{pi}$ (i.e., $V_{pi} \approx V_{erase}$) does inadvertent erasing of unselected programmed cells (curve b) take place and only at very low values of $V_{pi}$ (i.e., $V_{pi}$<3 V) does inadvertent programming of unselected erased cells (curve a) take place. Otherwise, selecting intermediate values of $V_{pi}$ improve reliability by making the integrated circuit memory device less susceptible to inadvertent programming and erasing, even if low pass voltages are used.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   a substrate containing first and second semiconductor regions of first conductivity type therein at adjacent nonoverlapping locations; and
   a memory device array containing first and second NAND strings of EEPROM cells in the first and second regions of first conductivity type, respectively, said first and second NAND strings electrically connected in antiparallel so that a gate electrode of a first select transistor of said second NAND string and a gate electrode of a second select transistor of said first NAND string are electrically connected to a first string selection line and a drain region of a first select transistor of said first NAND string and a drain region of the first select transistor of said second NAND string are electrically connected to a common bit line.

2. The memory device of claim 1, wherein a source region of the second select transistor of said first NAND string is shorted to the first semiconductor region of first conductivity type by a first source body line.

3. The memory device of claim 1, wherein a gate of the first select transistor of said first NAND string and a gate of a second select transistor of said second NAND string are electrically connected to a second string selection line.

4. The memory device of claim 3, wherein threshold voltages of the first and second select transistors of said first NAND string are unequal.

5. The memory device of claim 4, wherein the threshold voltage of the first select transistor of said first NAND string is less than the threshold voltage of the second select transistor of said first NAND string.

6. The memory device of claim 5, wherein the threshold voltage of the first select transistor of said first NAND string is less than a threshold voltage of a programmed EEPROM cell in said first NAND string; and wherein the threshold voltage of the second select transistor of said first NAND string is greater than the threshold voltage of a programmed EEPROM cell in said first NAND string.

7. The memory device of claim 5, wherein the first and second select transistors of said first and second NAND strings comprise NMOS field effect transistors; wherein the first and second semiconductor regions of first conductivity type comprise P-well regions which extend to a face of said substrate; wherein a source region of the second select transistor of said first NAND string is shorted to the first semiconductor region of first conductivity type by a first source body line; and wherein a source region of the second select transistor of said second NAND string is shorted to the second semiconductor region of first conductivity type by a second source body line.

8. The memory device of claim 7, wherein said first NAND string comprises a linear array of serially connected EEPROM cells having first and second ends thereof; wherein the first select transistor of said first NAND string is electrically connected in series between the common bit line and the first end of the linear array; and wherein the second select transistor of said first NAND string is electrically connected in series between the second end of the linear array and the first source body line.

9. The memory device of claim 2, wherein threshold voltages of the first and second select transistors of said first NAND string are unequal.

10. The memory device of claim 9, wherein a threshold voltage of the second select transistor of said first NAND string is equal to a threshold voltage of the first select transistor of said second NAND string.

11. The memory device of claim 10, wherein said first NAND string comprises a linear array of serially connected EEPROM cells having first and second ends thereof; wherein a source of the first select transistor of said first NAND string is electrically coupled in series to the first end of the linear array by a first depletion-mode transistor; and wherein the second select transistor of said first NAND string is electrically connected in series between the second end of the linear array and the first source body line.

12. The memory device of claim 11, wherein said second NAND string comprises a linear array of serially connected EEPROM cells having first and second ends thereof; wherein a source of the second select transistor of said second NAND string is electrically coupled in series to a second source body line by a second depletion-mode transistor; and wherein a source of the second depletion-mode transistor is shorted to the second semiconductor region of first conductivity type by the second source body line.

13. The memory device of claim 12, wherein a gate electrode of the first depletion-mode transistor is electrically connected to a gate electrode of the second select transistor of said second. NAND string by a second string selection line; and wherein a gate electrode of the second depletion-mode transistor is electrically connected to a gate electrode of the first select transistor of said first NAND string by a third string selection line.

14. An integrated circuit memory device, comprising:
a substrate containing first and second semiconductor regions of P-type conductivity type therein at adjacent nonoverlapping locations; and
a memory device array containing first and second NAND strings of NMOS EEPROM cells in the first and second regions of P-type conductivity type, respectively, said first and second NAND strings electrically connected in antiparallel so that a gate electrode of a first NMOS select transistor of said second NAND string and a gate electrode of a second NMOS select transistor of said first NAND string are electrically connected to a first string selection line, a gate of a first NMOS select transistor of said first NAND string and a gate of a second NMOS select transistor of said second NAND string are electrically connected to a second string selection line and N-type drain regions of the first NMOS select transistors of said first and second NAND strings are electrically connected to a common bit line.

15. The memory device of claim 14, wherein threshold voltages of the first and second NMOS select transistors of said first NAND string are unequal.

16. The memory device of claim 15, wherein the threshold voltage of the first NMOS select transistor of said first NAND string is less than the threshold voltage of the second NMOS select transistor of said first NAND string.

17. The memory device of claim 16, wherein the threshold voltage of the first NMOS select transistor of said first NAND string is less than a threshold voltage of a programmed EEPROM cell in said first NAND string; and wherein the threshold voltage of the second NMOS select transistor of said first NAND string is greater than the threshold voltage of a programmed EEPROM cell in said first NAND string.

18. The memory device of claim 16, wherein an N-type source region of the second NMOS select transistor of said first NAND string is shorted to the first semiconductor region by a first source body line; and wherein an N-type source region of the second NMOS select transistor of said second NAND string is shorted to the second semiconductor region by a second source body line.

19. A method of operating an integrated circuit memory device containing first and second NAND strings of EEPROM cells disposed in respective first and second nonoverlapping semiconductor regions of first conductivity type in a semiconductor substrate and electrically connected by respective first select transistors therein to a common bit line, comprising the steps of:
disconnecting the EEPROM cells in the second NAND string from the bit line by turning off the first select transistor therein;
applying a pass voltage to control gates of a plurality of unselected EEPROM cells in the first and second NAND strings;
connecting the EEPROM cells in the first NAND string to the bit line by turning on the first select transistor therein;
applying a first program voltage to a control gate of a selected EEPROM cell in the first NAND string and a selected EEPROM cell in the second NAND string; and
applying a program inhibition voltage to the second semiconductor region of first conductivity type during said step of applying a first program voltage to prevent inadvertent programming of the selected EEPROM cell in the second NAND string.

20. The method of claim 19, wherein said step of applying a program inhibition voltage comprises applying a program inhibition voltage which is greater than the pass voltage.

21. The method of claim 20, wherein said disconnecting step comprises turning off the second select transistor in the first NAND string; and wherein said connecting step comprises turning on the second select transistor in the second NAND string.

22. The method of claim 20, further comprising the steps of:
disconnecting the EEPROM cells in the first NAND string from the bit line by turning off the first select transistor therein;
connecting the EEPROM cells in the second NAND string to the bit line by turning on the first select transistor therein;
applying a second program voltage to a control gate of a selected EEPROM cell in the second NAND string and a selected EEPROM cell in the first NAND string; and
applying a program inhibition voltage to the first semiconductor region of first conductivity type during said step of applying a second program voltage to prevent inadvertent programming of the selected EEPROM cell in the first NAND string.

23. The method of claim 20, further comprising the steps of reading states of selected EEPROM cells in the first and second NAND strings one-at-a-time via the common bit line by:
turning on a second select transistor in the first NAND string and the first select transistor in the second NAND string;
turning on the first select transistor in the first NAND string and turning off a second select transistor in the second NAND string to enable a state of a selected EEPROM cell in the first NAND string to be read while the second select transistor in the first NAND string is turned-on; and
turning on the second select transistor in the second NAND string and turning off the first select transistor in the first NAND string to enable a state of a selected EEPROM cell in the second NAND string to be read while the first select transistor in the second NAND string is turned-on.

24. The method of claim 23,
wherein the second select transistor in the first NAND string has a threshold voltage greater than a threshold voltage of the first select transistor in the second NAND string;
wherein the first select transistor in the first NAND string has a threshold voltage less than a threshold voltage of the second select transistor in the second NAND string;
wherein said step of turning on a second select transistor in the first NAND string and the first select transistor in the second NAND string comprises applying a first read voltage greater than the threshold voltage of the first select transistor in the second NAND string to a gate electrode of the second select transistor in the first NAND string and to a gate electrode of the first select transistor in the second NAND string;
wherein said step of turning on the first select transistor in the first NAND string and turning off a second select transistor in the second NAND string comprises applying a second read voltage less than the threshold voltage of the second select transistor in the second NAND string to a gate electrode of the first select transistor in the first NAND string and to a gate electrode of the second select transistor in the second NAND string.

* * * * *